ELECTRO-LUMINESCENT SEMICONDUCTOR DEVICES

INVENTORS
JACQUES THILLAYS
JEAN C. DUBOIS
BY
AGENT

ELECTRO-LUMINESCENT SEMICONDUCTOR DEVICES

Filed Nov. 16, 1967 2 Sheets-Sheet 2

INVENTORS
JACQUES THILLAYS
JEAN C. DUBOIS
BY
Frank R. Trifari
AGENT

United States Patent Office 3,508,100
Patented Apr. 21, 1970

3,508,100
ELECTROLUMINESCENT SEMICONDUCTOR DEVICES

Jacques Tillays and Jean Claude Dubois, Caen, France, assignors, by mesne assignments, to U.S. Philips Corporation, New York, N.Y., a corporation of Delaware Filed Nov. 16, 1967, Ser. No. 683,577
Claims priority, application France, Dec. 28, 1966, 89,153
Int. Cl. H05b 33/00
U.S. Cl. 313—108 9 Claims

ABSTRACT OF THE DISCLOSURE

An electroluminescent semiconductor device having on the side from which the radiation emerges a transparent heat dissipator in the form of a solid or liquid for reducing the temperature of the semiconductor body portion through which the radiation passes in order to shift its absorption edge to reduce absorption losses.

Figure 1:
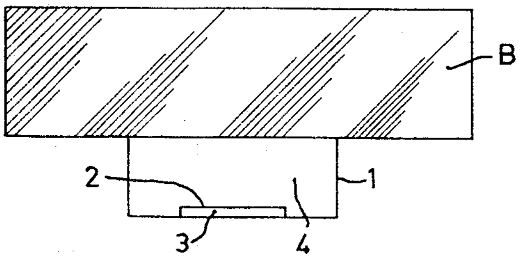

It is known that devices comprising a semiconductor crystal with an electroluminescent junction have a low light output and dissipate a great amount of heat and that, in general, their light output diminishes when the temperature increases.

For this reason the opaque base on which said crystal is mounted and which is disposed on the side opposite the side where the light emerges is, in general, constructed so that the greatest possible portion of the developed heat is conducted away. However, these bases cannot absorb the heat of the crystal portions lying on the other side, i.e., the side adjacent the light emanating side.

In order to increase the efficiency of such a device, in which the junction is obtained by diffusion, it is preferred, as is known, to arrange the emanating side in the weaker doped region of the crystal. Between the junction and said side the emitted rays traverse low absorption crystal layers, termed dielectric type layers, since the most highly doped region has a considerable absorption of the metallic type.

However, such a device exhibits a poor transfer of the emitted light because it forms a selective filter absorbing the photons of an energy exceeding 1.40 ev., which are the very photons emitted in great numbers by the junction.

The present invention obviates these disadvantages.

According to the invention the device comprising a semiconductor crystal having an electroluminescent junction separating the crystal into two regions of different conductivity types and different impurity concentrations is characterized in that it comprises on the side of the crystal where the light emitted by said junction emanates means producing such a temperature gradient between the junction and said side that the junction has a higher temperature than the crystal layers traversed by the radiation.

Said means are preferably arranged on the crystal region of low impurity concentration having an absorption of the dielectric type.

As will be explained hereinafter with reference to FIGS. 2*a* and 2*b* the absorption of the radiation traversing the various crystal layers diminishes and the maximum emission is considerably higher in intensity and energy than that obtained in the absence of said means according to the invention.

In a first embodiment said means are formed by a solid transparent body having a fairly good thermal conductivity, for example of alumina or beryllia, which body is adapted to absorb partly the heat developed in the adjacent crystal parts.

In a second embodiment of this device said temperature gradient is obtained by means of a liquid contained in an envelope transparent to the emitted radiation.

The liquid employed is chosen not only because of its thermal properties but also because of its optical properties. In fact the mass traversed by the light beam, either a solid mass or a circulating liquid, and the envelope of this liquid form wholly or partly the optical output system of the electroluminescent device.

The refractive index $n_2$ of the liquid concerned may in particular be chosen in connection with the refractive index $n_1$ of the semiconductor crystal and with the refractive index $n_3$ of the surroundings so that definite properties of the optical system are obtained. For example, the glass reflection may be reduced by providing for $n_2$ a value approximately equal to $n_2=\sqrt{n_1 n_3}$.

It is advantageous to shape said body and/or the said envelope in known manner in the form of a spherical diopter whose aplanar point nearest its centre is disposed in the vicinity of the electroluminescent junction.

It is known that, when the refractive indices of said body or those of the liquid and of the envelope are substantially equal to the index of the crystal, a so-called a planar device is obtained such that almost all rays emitted by the junction on the spherical side (Weierstrass sphere) will emanate since the total reflection on the light emanating face is then suppressed for the major part.

Moreover, with such an arrangement the angular aperture of the emanating radiation in the air is such that its sine is equal to the inverse of the refractive index of the portion of the Weierstrass sphere for the emitted light and the diagram of the resultant radiation is restricted to a cone of small aperture, instead of being dispersed in a space angle of $2\pi$ steradians.

The invention provides important advantages. It permits in particular of reducing the heat and of maintaining one of the regions of the diode having the smaller doping and being, for example, of the n-type conductivity at a constant temperature, whereas the region of the opposite type is heated by the passage of the current and soon attains its temperature of equilibrium. This results in a temperature gradient across the crystal and an increase in the emitted luminous flux so that the efficiency of the electroluminescent device is considerably improved.

The following description with reference to the accompanying drawing given by way of non-limiting example will show how the invention may be carried into effect, the details resulting from the drawings and the text forming, of course, part of said invention.

FIG. 1 is a diagrammatic sectional view of an electroluminescent device comprising means according to the invention adapted to produce a suitable temperature gradient in the crystal of said device.

Figures 2A, 2B:
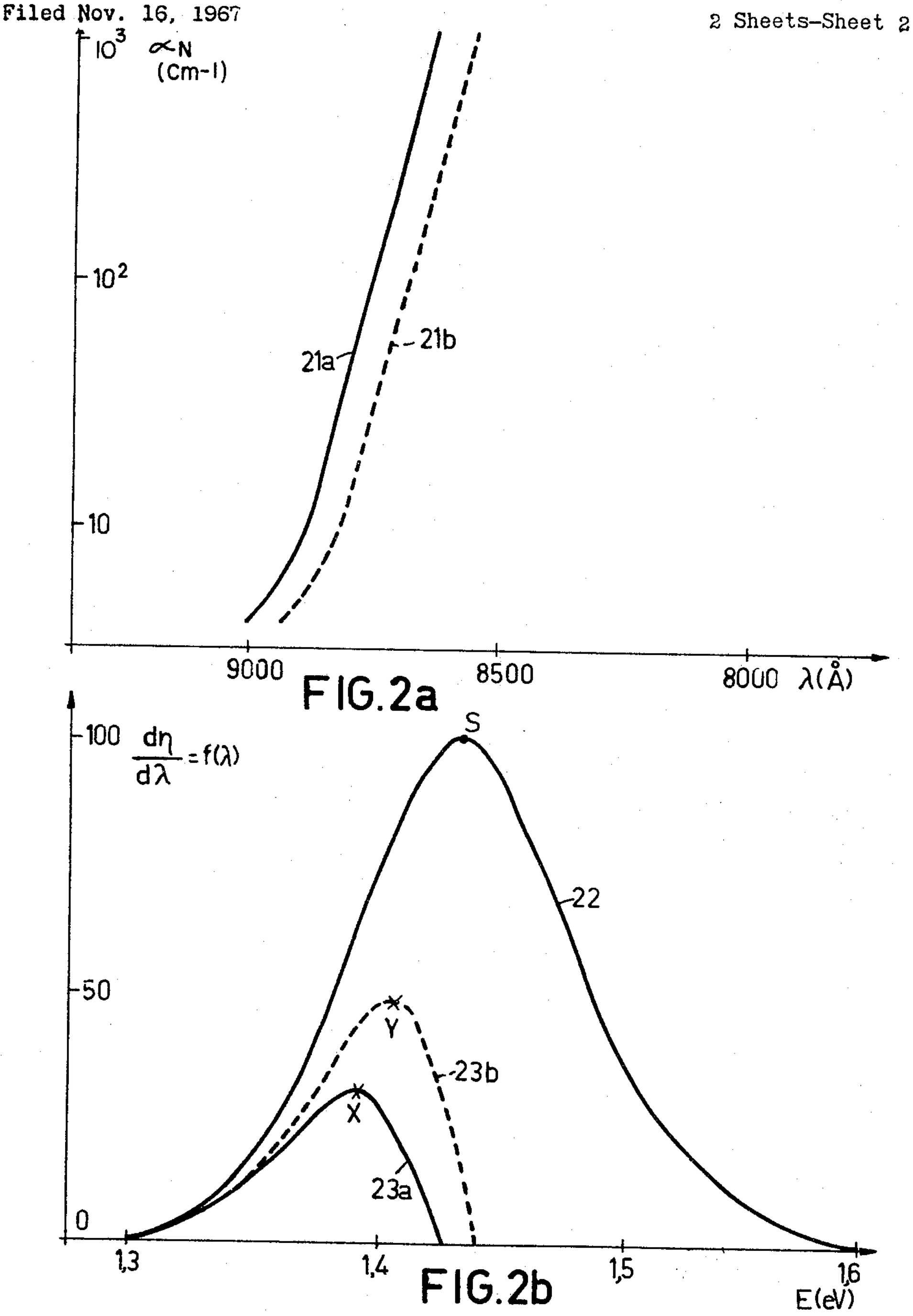

FIGS. 2*a* and 2*b* show the absorption curve and the light emission curve respectively and their course as a function of the temperature of an electroluminescent device.

Figure 3:
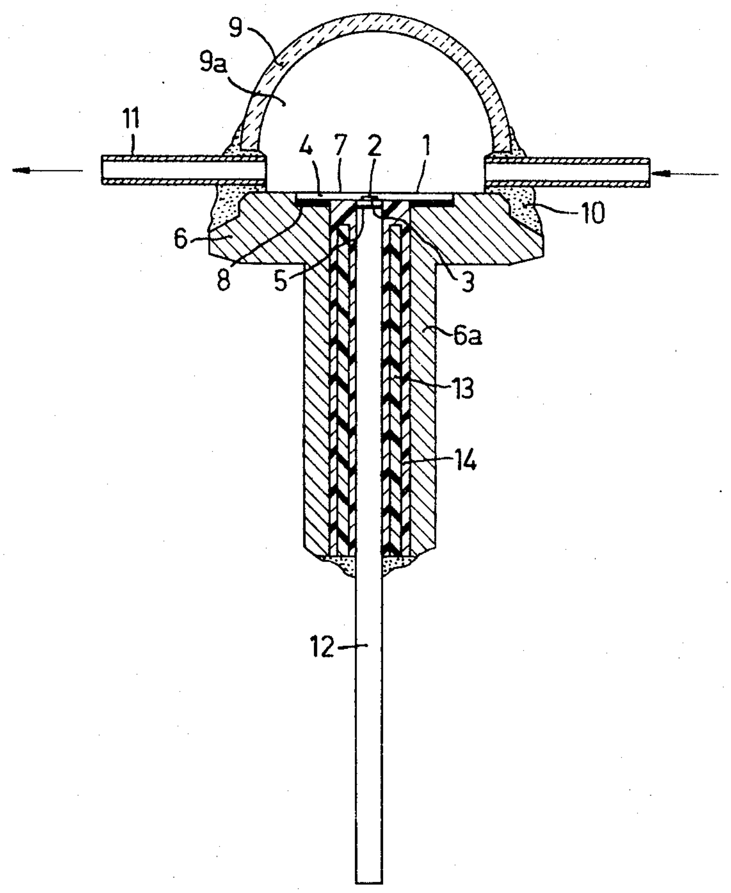

FIG. 3 shows a variant of the means capable of producing a temperature gradient inside an electroluminescent device.

The electroluminescent device shown in FIG. 1 comprises a semiconductor crystal 1 of given conductivity type, for example, n-type conductivity. In this crystal is formed, for example, by diffusion, a junction 2 separating a region 4 of the conductivity type of the crystal 1 from a region 3 of the opposite conductivity type. This junction is capable of emitting a luminous ray across the region 4, which is optically transparent and is cooled by an optically transparent block B, formed by alumina or beryllia.

This block has a mass and a volume which are considerable with respect to the crystal 1 and it absorbs partially the heat of the adjacent crystal portions so that a temperature gradient is formed such that the junction is at a temperature exceeding that of the crystal layers traversed by the radiation.

FIG. 1 shows an n-type conductive crystal 1. It will be obvious that as well a low-doped material of p-type conductivity may be employed, in which, for example, by diffusion, a highly doped n-type conductive region is formed. In this case the radiation is emitted across the medium P, instead of being emitted across the N-type medium, but the cooling block according to the invention maintains at any rate its entire efficiency.

The curve 21*a* of FIG. 2*a* illustrates the variations of the absorption coefficient $\alpha N$ (expressed in cm.$^{-1}$) of an electroluminescent device as a function of wavelength $\lambda$ (expressed in angstrom) of the radiation emitted by the junction, whereas the curve 22 of FIG. 2*b* illustrates the variations of the spectral emission $$\frac{d\eta}{d\lambda}=f(\lambda)$$

of the junction of the same device as a function of the energy (expressed in electrovolts) of the emitted radiation, wherein $\eta$ is the total output of the device. The curve 22 is drawn empirically and a value 100 is given to the maximum S of $d\eta/d\lambda$. These two curves 21*a* and 22 relate to an electroluminescent device which does not comprise the means according to the invention, whilst it is at its temperature of equilibrium. The light flux virtually emitted by this device is illustrated by the curve 23*a*, which is a combination of the curves 21*a* and 22, whilst the maximum emission is designated by X.

It will be apparent that to an energy E corresponds a wavelength $\lambda$. Therefore the values are plotted on the corresponding axes so that they may be superimposed.

When the means according to the invention are employed in the same electroluminescent device, so that the least doped region is cooled, a temperature gradient is obtained between the poorly doped region and the junction. This results in a displacement of the absorption curve 21*a* towards the position 21*b*, which corresponds to less high wavelengths. On the contrary the curve 22 remains substantially unchanged. With a given wavelength, for example, 8800 A. the spectral emission of the junction does not vary, whilst the light absorption of the least doped region diminishes. As a result, the curve of the light flux emitted by the electroluminescent device thus cooled is displaced from 23*a* to 23*b*, whilst the maximum emission is at Y and having a higher intensity and energy than the emission X. Thus, the photons having an energy exceeding 1.40 ev. are absorbed to a considerably lesser extent.

FIG. 3 shows a particularly advantageous embodiment of the invention having a liquid circulating across a spherical diopter (Weierstrass sphere).

The device shown in this figure comprises a disc-shaped doped crystal 1 of a given conductivity type, for example n-type. Through one of the faces of this crystal a junction 2 is formed, for example, by diffusion, which emits the light radiation and which separates a region 4 of the conductivity type of the crystal 1 from a region 3 of the opposite conductivity type. On the surface of the region 3 is deposited a reflecting metal to form a mirror 5. The crystal 1 is welded at 8 on the same side as the mirror but beyond the latter by means of soft solder, for example tin, to a metal base 6, which is prolonged on the side remote from the crystal by a tube 6*a*, serving as the negative terminal if the crystal is of the n-type conductivity. The side 7 of the crystal opposite the base 6 is perfectly flat and polished and is in contact with a cooling liquid circulating through the space 9*a*.

This space is bounded by a rigid, transparent wall 9, for example, of quartz, which forms a spherical diopter, arranged so that the junction is disposed in the vicinity of the aplanar point of the latter nearest its centre. The wall 9 is sealed to the base 6 of high conductivity, for example, of nickel copper by means of an adhesive material 10, for example, an epoxy resin. Said wall 9 has two apertures in which two sleeves 11 are sealed through which a cooling liquid can flow, said liquid having a refractive index near that of the doped crystal and being formed, for example, by methylene iodide ($n=1.75$) when the crystal consists of gallium arsenide.

A cylindrical metal pin 12 of high conductivity, for example of silver-plated copper, is arranged on the free face of the mirror 5. This contact may advantageously be established by soldering, provided the soldering method does not adversely affect the optical properties of the mirror and not any point of the reflective surface is altered.

A rigid tube 13 of insulating material, for example, glass is arranged between the base 6 and the pin 12 and the space 14 between the tube 13 and the crystal on the one hand and between the base 6 and the pin 12 on the other hand is filled with an insulating material, for example, a cast epoxy resin for ensuring the mechanical disposition of the assembly.

The pin 12 is longer than the tubes 6*a* and 13 so that by its end it forms the second terminal of the device, which is positive in this embodiment.

It will be evident that the crystal 1 could be cooled by a less bulky block B but provided with cooling vanes. Moreover, the wall 9 could be provided with such vanes, which under given conditions could prevent a liquid from circulating through it. This liquid is then cooled by means of said vanes.

It will be apparent that modifications may be made in the embodiments described in the foregoing, especially by replacing technical means by equivalents within the scope of the invention.

What is claimed is:

1. A semiconductor device comprising a semiconductor body having opposite conductivity type regions containing different concentrations of active dopants and forming an electroluminescent p-n junction, means connected to the regions for passing current through the junction causing it to emit radiation and to heat up, one of said regions having an exciting surface from which the radiation emitted by said junction when current is passed through it is capable of emanating from the device, and substantially radiation transparent means thermally coupled to said exiting surface for increasing the heat dissipation thereof, said heat-dissipating means having a thermal conduction at least equal substantially to that of alumina and at which the body portion through which the radiation passes from the junction to the exiting surface is maintained at such a reduced temperature relative to that of the junction that its absorption edge is significantly shifted in a direction reducing absorption losses of the passing radiation.

2. A semiconductor device as set forth in claim 1 wherein the semiconductor body is of gallium arsenide, and the said one region having the exiting surface contains the lower concentration of dopants.

3. A semiconductor device as set forth in claim 1 wherein the heat-dissipating means is a solid body selected from the group of alumina and beryllia.

4. A semiconductor device as set forth in claim 1 wherein the heat-dissipating means comprises a radiation-transparent envelope containing a liquid coolant.

5. A semiconductor device as set forth in claim 4 wherein means are provided for passing the liquid coolant through the envelope.

6. A semiconductor device as set forth in claim 1 wherein the heat-dissipating means are shaped in the form of a sphere segment whose aplanar point nearest the sphere center is located in the vicinity of the p-n junction.

7. A semiconductor device as set forth in claim 4 wherein the semiconductor comprises gallium arsenide, and the coolant is methylene iodide.

8. A semiconductor device as set forth in claim 4 wherein the envelope comprises quartz.

9. A semiconductor device as set forth in claim 1 wherein the said one region has n-type conductivity.

References Cited

UNITED STATES PATENTS

| | | | |
|---|---|---|---|
| 3,303,432 | 2/1967 | Garfinkel et al. | 331—94.5 |
| 3,304,430 | 2/1967 | Biard et al. | 250—217 |

RAYMOND F. HOSSFELD, Primary Examiner

U.S. Cl. X.R.

317—234